United States Patent [19]

Chu et al.

[11] 4,452,645
[45] Jun. 5, 1984

[54] METHOD OF MAKING EMITTER REGIONS BY IMPLANTATION THROUGH A NON-MONOCRYSTALLINE LAYER

[75] Inventors: Wei-Kan Chu, Poughkeepsie; Ingrid E. Magdo, Hopewell Junction; Hans S. Rupprecht, Yorktown Heights, all of N.Y.

[73] Assignee: International Business Machines Corporation, Armonk, N.Y.

[21] Appl. No.: 242,961

[22] Filed: Mar. 12, 1981

Related U.S. Application Data

[62] Division of Ser. No. 93,666, Nov. 13, 1979, abandoned.

[51] Int. Cl.³ ................ H01L 21/265; H01L 21/225
[52] U.S. Cl. .................................. 148/1.5; 29/576 B; 148/187; 357/34; 357/59; 357/91
[58] Field of Search ............. 148/1.5, 187; 29/576 B; 357/34, 91, 59

[56] References Cited

U.S. PATENT DOCUMENTS

| | | | |
|---|---|---|---|
| 4,063,967 | 12/1977 | Graul et al. | 148/1.5 |
| 4,109,273 | 8/1978 | Glasl et al. | 357/35 |
| 4,125,426 | 11/1978 | Inayoshi et al. | 29/578 |
| 4,151,006 | 4/1979 | De Graaff et al. | 148/1.5 |
| 4,190,466 | 2/1980 | Bhattacharyya et al. | 148/1.5 |
| 4,216,030 | 8/1980 | Graul et al. | 148/1.5 |
| 4,234,357 | 11/1980 | Scheppele | 148/1.5 |
| 4,243,435 | 1/1981 | Barile et al. | 148/1.5 |
| 4,301,588 | 11/1981 | Horng et al. | 148/1.5 |
| 4,313,255 | 2/1982 | Shinozaki et al. | 29/576 B |
| 4,389,255 | 6/1983 | Chen et al. | 148/1.5 |

OTHER PUBLICATIONS

Geipel et al., IBM-TDB, 20 (1977) 2590.
Anantha et al., IBM-TDB, 22 (1979) 575.

*Primary Examiner*—Upendra Roy
*Attorney, Agent, or Firm*—Wolmar J. Stoffel

[57] ABSTRACT

A transistor structure is provided with an emitter which is formed from non-monocrystalline silicon which is caused to be converted to monocrystalline silicon during the manufacture of the transistor. In the process of manufacturing the present semiconductor structure, a subcollector is formed in a semiconductor substrate. The subcollector dopant out diffuses into a subsequently deposited epitaxial layer. A base region is formed in the epitaxial layer of a conductivity type opposite that of the conductivity type of the subcollector. This results in a PN junction between the base region and the out diffused subcollector impurities forming the collector of the transistor.

A layer of non-monocrystalline silicon is deposited on the epitaxial layer. At least a portion of the non-monocrystalline silicon forms a precursor for an emitter region which is contiguous to but vertically displaced from the surface of the base region. The emitter precursor is then bombarded with ions of a conductivity type that is the same as the conductivity type of the subcollector. The ion bombardment is at a dose and energy level sufficient to displace a portion of the Gaussian distribution of the ions across the interface between the non-monocrystalline layer and the epitaxial layer and into the base region. Thereafter, the structure is annealed by suitable means to drive a portion of the ions deeper into the base region and to convert the non-monocrystalline silicon of the emitter precursor into a monocrystalline emitter region.

11 Claims, 15 Drawing Figures

METHOD OF MAKING EMITTER REGIONS BY IMPLANTATION THROUGH A NON-MONOCRYSTALLINE LAYER

This is a division, of application Ser. No. 093,666 filed Nov. 13, 1979, now abandoned.

BACKGROUND OF THE INVENTION

1. Field of the Invention

This invention relates to semiconductor structures and more particularly to a semiconductor transistor structure having a unique emitter structure and an improved gain.

2. Description of the Prior Art

Semiconductor transistor structures are well known in the art. Traditionally, to form an NPN structure, a highly doped N+ subcollector region is diffused into a major surface of a semiconductor substrate. An epitaxial layer is then deposited over the substrate. The subcollector partially out-diffuses into the epitaxial layer during the deposition of this layer. A base region with a P-type impurity is then diffused into the epitaxial layer in contact with the subcollector region. An N-type impurity, such as arsenic or phosphorus, for example, is then diffused into the base region forming an emitter region of the transistor. The emitter region is wholly contained beneath the surface and within the base region of the epitaxial layer.

The preferred method, for reasons of economics and control, for diffusing an impurity to form the emitter region is by ion implanation. The use of ion implanation to form an emitter region in the base region of the epitaxial layer, however, has led to numerous problems.

During ion implantation, the monocrystalline nature of the epitaxial layer is disrupted as a consequence of the radiation damage. After completion of the ion bombardment, the crystalline structure is restored by subjecting the material to an annealing heat treatment. While the annealing heat treatment is sufficient to restore most of the disrupted structure, some residual damage of the structure remains. These crystalline defects can cause impaired performance of the transistor device. Moreover, the annealing heat treatment causes the implanted doping ions to migrate further into the base region. The drive-in of the implanted doping ions results in providing an emitter depth that is greater than desired. The juxtaposition of the emitter sidewall with the base adjacent the emitter sidewal results in providing parasitic capacitance that is higher than desired.

A further problem is that subsequent metallization of the emitter takes place on the surface of the epitaxial layer. The usual method is to deposit platinum onto the silicon surface at the face of the emitter. Subsequent treatment results in providing platinum silicide at the surface. The silicon for forming the platinum silicide is "stolen" from the silicon of the epitaxial layer and lateral growth of the platinum silicide inherently occurs. Such lateral growth can result in shorting of the emitter to the base at the surface. Because of the extremely small spaces utilized in forming semiconductor transistor structures, such possibility of emitter shorting is a real and continuing problem.

It would be desirable to provide a transistor with a reduced emitter to base sidewall contact so as to reduce parasitic capacitance engendered between the emitter and base. It would also be desirable to provide a transistor structure with a shallower emitter wherein the emitter is at least partially isolated from the base region. A transistor with a smaller emitter can switch from conduction to nonconduction and vice versa faster. It would also be desirable to provide an emitter structure wherein metallization takes place at a location remote from possible bridging contact so as to reduce penetration difficulties.

SUMMARY OF THE INVENTION

In accordance with the present invention, a transistor structure is provided with an emitter which is formed from non-monocrystalline silicon which is caused to be converted to monocrystalline silicon during the manufacture of the transistor. In the process of manufacturing the present semiconductor structure, a subcollector is formed in a semiconductor substrate. The subcollector dopant out diffuses into a subsequently deposited epitaxial layer. A base region is formed in the epitaxial layer of a conductivity type opposite that of the conductivity type of the subcollector. This results in a PN junction between the base region and the out diffused subcollector impurities forming the collector of the transistor.

A layer of non-monocrystalline silicon is deposited on the epitaxial layer. At least a portion of the non-monocrystalline silicon forms a precursor for an emitter region which is contiguous to but vertically displaced from the surface of the base region. The emitter precursor is then bombarded with ions of a conductivity type that is the same as the conductivity type of the subcollector. The ion bombardment is at a dose and energy level sufficient to displace a portion of the Gaussian distribution of the ions across the interface between the non-monocrystalline layer and the epitaxial layer and into the base region. Thereafter, the structure is annealed by suitable means to drive a portion of the ions deeper into the base region and to convert the non-monocrystalline silicon of the emitter precursor into a monocrystalline emitter region.

The resultant structure has the advantage that the absolute depth of the emitter is less than the depth of an emitter formed by direct bombardment of ions into the epitaxial layer. Furthermore the sidewall contact between the emitter region and the base region is greatly reduced and the undesirable parasitic capacitance from emitter to base is substantially reduced. A further and very significant advantage of the present invention is the ability to metallize the emitter at a point spaced from the surface of the epitaxial layer so as to avoid any possibility of metal penetration. It is a further unexpected advantage of the present invention that the transistor structure produced in accordance with the present invention has a substantially increased gain in comparison with prior art transistor structures.

Accordingly, it is a principal object of the present invention to provide an improved semiconductor structure by forming an emitter region non-monocrystalline silicon which is subsequently converted to monocrystalline silicon.

It is another object of this invention to reduce parasitic capacitance between the emitter and the base of a transistor structure.

It is still another object of this invention to provide an improved method for metallization of transistor structures.

It is a further object of this invention to provide an improved semiconductor transistor structure with enhanced gain.

The foregoing and other objects, features and advantages of the invention will become more apparent from the following detailed description of a preferred embodiment of the invention as illustrated in the accompanying drawings.

IN THE DRAWINGS

DESCRIPTION OF THE PREFERRED EMBODIMENT

For the preferred embodiment, a P-type silicon substrate is utilized to form an NPN type bipolar semiconductor device. It should be understood, however, that the invention is also applicable to forming opposite conductivity type bipolar transistors as well as to other types of devices. In particular, the general method of the invention for forming an emitter can be used to form N channel or P channel FET devices. No improvement is obtained in the operating characteristics of FET devices manufactured in accordance with the invention; however, the method is readily adapted to more easily form FET devices during concurrent manufacture of bipolar transistors.

Figure 4:
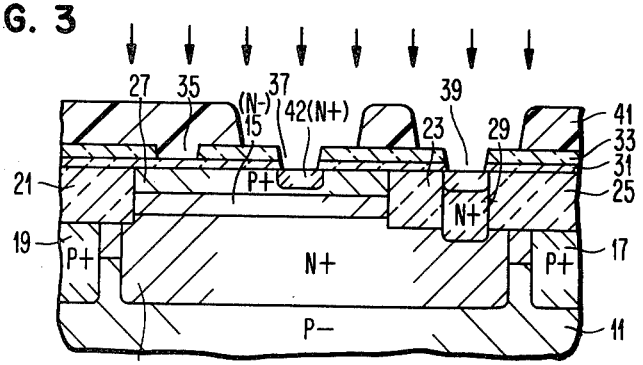
Figure 5:
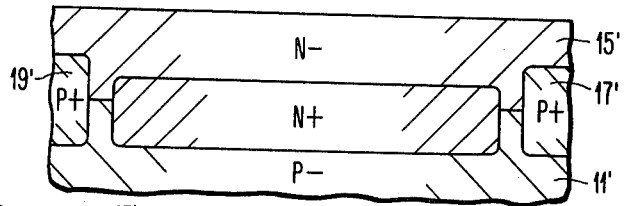
FIGS. 5-9 depict various stages in the preparation of a semiconductor transistor structure in accordance with the method of the invention.
Figure 6:
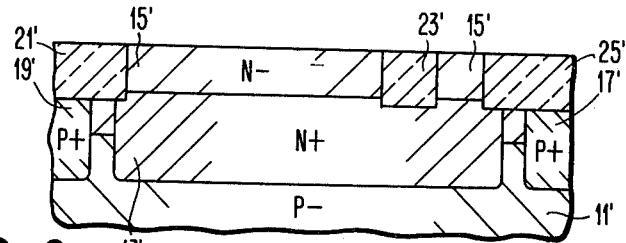
Figure 7:
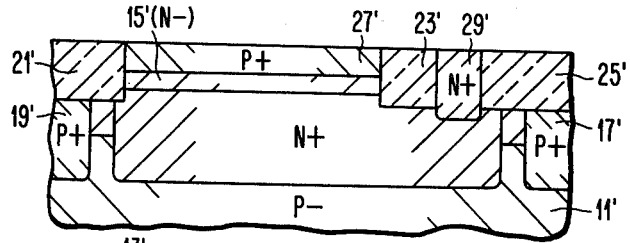

Referring now to FIGS. 1-4, various stages in the conventional prior art preparation of bipolar transistors are described. Various steps, such as thermal oxidation, masking and etching, which are well known in the art are not particularly shown in the sequence of steps set forth in FIGS. 1-4. As seen in FIG. 4 a wafer 11 has an N+ region 13 formed therein by thermally diffusing an N+ impurity, such as phosphorus, arsenic, antimony or the like. The N+ region 13 is formed through a window in an oxide layer in accordance with conventional techniques. For reasons well known to those skilled in the art, arsenic is preferable for forming region 13 which will subsequently serve as the buried subcollector of the NPN transistor. The initial concentration, $C_O$, of arsenic is preferably $\geq 10^{21}$ atoms/cm$^3$.

Figure 1:
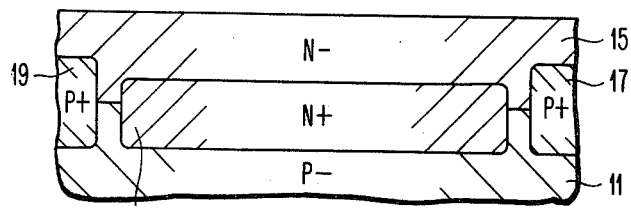
FIGS. 1-4 depict various stages in the preparation of a semiconductor transistor structure by a known pior art method.

An epitaxial layer 15 is formed on the surface of wafer 11. During formation of the epitaxial layer 15, the N+ region 13 out diffuses into the epitaxial layer 15 as shown in FIG. 1. P type regions 17 and 19 are diffused into the surface of wafer 11 prior to forming epitaxial layer 15. The P+ regions serve as isolation regions. The P+ regions out diffuse during formation of the epitaxial layer 15, as shown in FIG. 1. The P+ regions 17 and 19 are formed by conventional diffusion techniques with the impurity preferably being boron, although other P type impurities can be used. The initial concentration, $C_O$, of boron is preferably $\geq 10^{20}$ atoms/cm$^3$.

Figure 2:
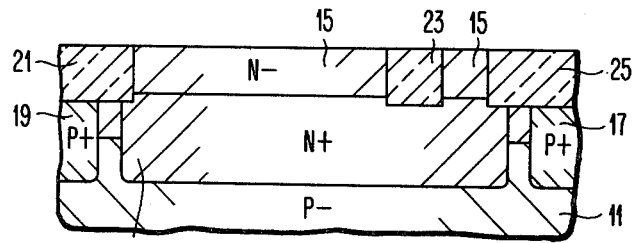
Figure 3:
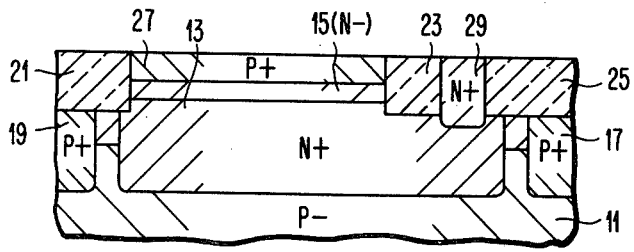

Next, as best seen in FIG. 2, recessed oxide isolation (ROI) regions 21, 23 and 25 are formed in epitaxial layer 15. The method of forming ROI regions in monocrystalline silicon is described in U.S. Pat. No. 4,044,454 to I. E. Magdo. In this method, those surfaces of the wafers in which it is not desired to form ROI are covered by an insulating material, such as silicon nitride. Openings are made in the nitride layer where ROI is to be formed. The exposed monocrystalline regions are first etched and then oxidized-through thermally so that the oxidation reaches down to the P+ regions 17 and 19 and to the N+ subcollector region 13.

After the formation of the ROI region, diffusions are made selectively into the epitaxial layer 15 to form the N+ reach through region 29. The reach through region 29 serves as a collector contact. The initial concentration, $C_O$, of the N+ dopant, preferably arsenic, is preferably $\geq 10^{20}$ atoms/cm$^3$.

The P+ base region 27 is then formed in the surface of epitaxial layer 15 by any suitable means, such as diffusion or ion implantation. Diffusion is preferably accomplished by means of boron triborate with an initial surface concentration of $4\times 10^{19}$ atoms/cm$^3$. This level is subsequently reduced by base reoxidation. The base can also be formed with ion implant, through oxide, where the $C_O \sim 10^{18}$ atoms/cm$^3$. If subcollector region 13 is out diffused sufficiently to contact base region 27, this intersection of two heavily doped junctions results in a low breakdown voltage. Thus, if a higher breakdown voltage is desired, a portion of $N^{31}$ epitaxial layer is caused to lie between the P+ base region 27 and the N+ subcollector region 13. Control of the N+ subcollector out diffusion to achieve this purpose is described in U.S. Pat. No. 4,016,596 to Magdo et al.

As shown in FIG. 4, silicon dioxide layer 31 and silicon nitride layer 33 are then deposited on the surface of epitaxial layer 15 in accordance with conventional techniques. Window 35 is then made through silicon nitride layer 33 and windows 37 and 39 are made through silicon nitride layer 33 and silicon dioxide layer 31. Photoresist 41 is then applied to block out window 35 and to leave windows 37 and 39 exposed for implantation of N+ doping ions to form emitter region 42, and collector contact region 39.

Ion bombardment or ion implant has become the preferred method for forming emitter regions in the P base region. In general, ion implanation proceeds at an energy level of $\sim 50$ keV and a dose of $\sim 1\times 10^{16}$ to implant a peak concentration of from about $10^{21}$ to about $5\times 10^{21}$ atoms/cm$^3$ into the surface of the P+ base region 27. During ion implantation the monocrystalline structure of the epitaxial layer is disrupted and ruptured. The disruptions are partially cured by annealing the transistor structure at a temperature of 900°-1000° C. for a period of 30-60 minutes. While the annealing treatment cures most of the disruptions caused by the ion implantation and electrically activates most of the implanted ions, there are still an appreciable number of dislocations remaining in the emitter structure and these tend to impair performance. Furthermore, the annealing treatment serves to out diffuse the N+ doping ions and to cause the emitter region to be expanded from the surface of the epitaxial layer.

In general, the initial ion bombardment implants the deepest ions to a depth of from about 300 Å to about 400 Å. The out diffusion caused by annealing treatment extends the emitter region to a depth of from about 3000 to about 5000 Å. In order to anneal out most of the necessary defects it is not usually possible to have an emitter depth of less than about 2000 Å after annealing using ion implantation into the epitaxial layer surface. Since parasitic capacitance is engendered between the junction of the P+ base region and the emitter region, it is desirable to limit the depth of the emitter region and the extent of the junction between the sidewall of the emitter region and the base region.

Referring now to FIGS. 5-10, the method and transistor structure of the present invention will be described. In general, FIGS. 5-8 depict stages in the preparation of the transistor structure which are identical to the stages described hereinabove in reference to FIGS. 1-3. The common elements are numbered the same using prime designations.

Figure 8:
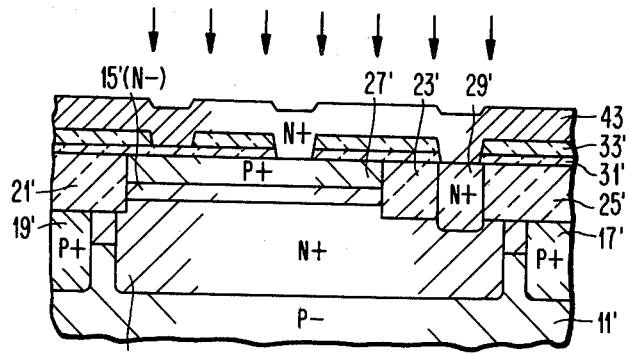
Figure 9:
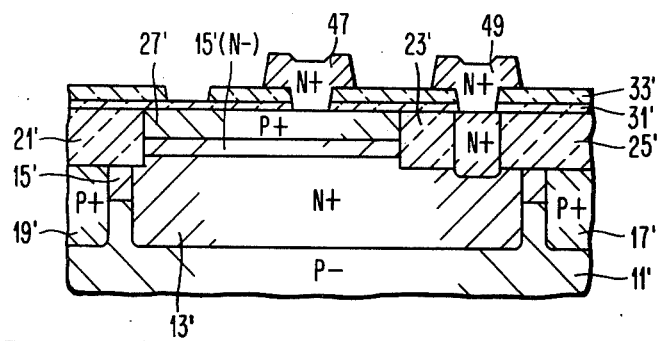

Silicon dioxide layer 31' and silicon nitride layer 33' are deposited, as shown in FIG. 8, and windows 34', 37' and 39' are opened, as previously described. A layer of non-monocrystalline silicon (sometimes referred to herein as polysilicon) 43 is then deposited on the surface of the transistor structure. As shown in FIG. 8, the polycrystalline silicon fills the windows 35', 37' and 39'. It should be understood that the structure shown in FIG. 8 and FIG. 9 is greatly exaggerated. For example, the silicon dioxide layer is generally about 400-800 Å, the silicon nitride layer 33 is generally from about 1000 to about 2000 Å. The polysilicon layer is generally from about 500 to about 1500 Å. The depressions shown in FIG. 4 over the window areas 35, 37 and 39 are relatively inconsequential.

After deposition of the polycrystalline layer 43, the polycrystalline layer is subjected to ion implantation in the regions adjacent window 37', which region is a precursor which is to become the emitter for the bipolar transistor. It is not necessary to mask the transistor structure during the ion implantation since areas other than the windows 37' and 39' are covered with SiO$_2$ or the SiO$_2$/Si$_3$N$_4$ sandwich. It is only necessary that the ion implantation proceed over the surface of the window 37. Thereafter, the transistor structure is annealed for a period sufficient to drive the implanted ions deeper into the base region beneath window 37 and to convert the polycrystalline silicon into monocrystalline silicon.

Figure 15:
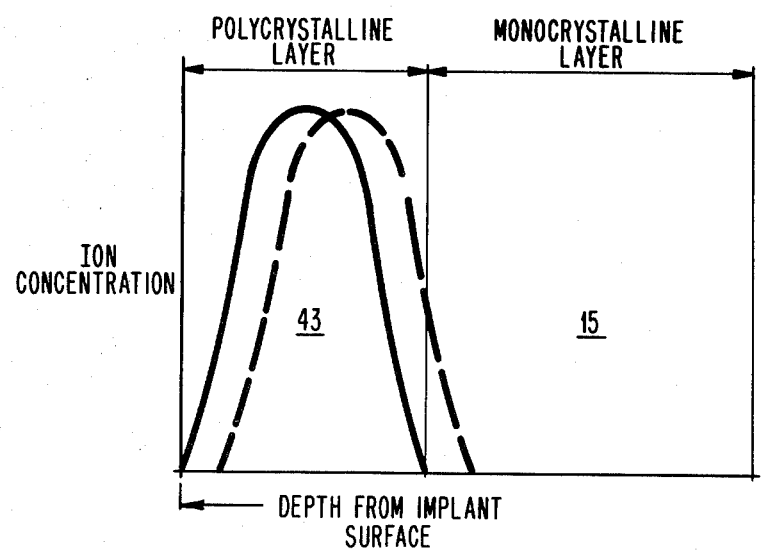
FIG. 15 is a schematic view showing the Gaussian distribution of ions in the non-monocrystalline layer and epitaxial layer.
Figure 10:
FIGS. 10-14 are enlarged views of the epitaxial surface layer, the polysilicon layer and the interface area formed during preparation of an emitter in accordance with the invention.
Figure 11:
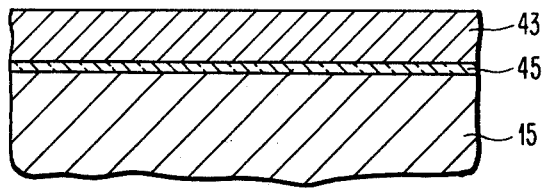

The process of the present invention may best be understood with reference to FIGS. 10-14 and the diagram of FIG. 15. The initial monocrystalline silicon of epitaxial layer 15 is shown in FIG. 10. While the initial silicon layer 15 is shown, for purposes of illustration of the embodiment of the present invention, to be substantially undoped, it should be understood that in the practice of the invention the epitaxial layer 15 would have regions of different conductivity types and concentrations, such as the P+ base region 27. In FIG. 11, a layer of polysilicon 43 is deposited onto the epitaxial layer of monocrystalline silicon 15. The polycrystalline silicon may be deposited by conventional or low pressure chemical vapor deposition of silicon carried out at temperatures on the order of 650° C. with the silicon vapor being derived from sources such as silane or silicon tetrachloride. Alternatively, the layer of polycrystal silicon may be deposited by standard evaporation techniques, such as described by C. Canali et al., Journal of Applied Physics, Vol. 46, No. 7, July 1975, pp. 2831-2835, except that the silicon is evaporated directly onto the silicon substrate or by sputter-deposition. For purposes of this illustration, the polycrystalline layer 43 has a thickness of about 800 Å.

It should be noted that while the polycrystalline silicon layer 43 is deposited directly onto a monocrystalline silicon substrate, native silicon dioxide may be expected to inherently form during handling procedures. While this silicon dioxide will at best be a layer having a thickness on the order of from 5-20 Å and a varying continuity, for convenience of illustration this silicon dioxide layer is indicated in FIG. 11 as layer 45.

Figure 12:
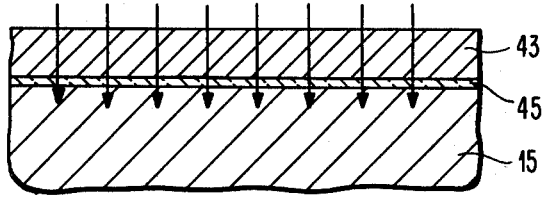

Next, as shown in FIG. 12, the substrate is subjected to an ion implantation with a doping ion, such as arsenic. The bombardment may be conducted utilizing any conventional ion implantation or bombardment equipment at an energy level and dosage sufficient to displace the Gaussian distribution of the bombarding ions across the interface between the polycrystalline layer 43 and the monocrystalline epitaxial layer 15 and into the P+ base region 27. This requirement is best seen by reference to FIG. 15. As shown in FIG. 16, the concentration gradient of ions resulting from ion implantation forms a Gaussian type distribution. At certain levels of dosage and energy, the concentration gradient will be wholly contained within the polycrystalline layer as shown by the solid line in FIG. 16. If the Gaussian distribution is wholly contained within the polycrystalline layer, subsequent annealing treatment will not convert the polycrystalline layer to a monocrystalline state. If, however, the dosage exceeds a predetermined threshold dosage for the particular ion being implanted and energy levels are sufficient to drive the Gaussian distribution across the interface between the polycrystalline layer and the monocrystalline layer, subsequent annealing treatment will cause the polysilicon layer to convert to a monocrystalline state.

Utilizing arsenic ion, a bombardment carried out at room temperature at an energy level of 50-200 keV and at a dosage level at least about $10^{16}$ ions/cm$^2$ will be sufficient to cause the Gaussian distribution to cross the interface between the polycrystalline layer and the monocrystalline layer. If it is desired to use a smaller dosage of doping ion, the ion bombardment can be effected in a two-stage manner using the doping ion in a first stage treatment and a non-doping ion, such as silicon or hydrogen, in a second stage treatment. The two-stage treatment may also be used to form P+ emitter regions when the dosage level of implantation of the P+ doping ion is below the threshold level and/or the energy level is insufficient to cause the Gaussian distribution to cross the interface.

Figure 13:
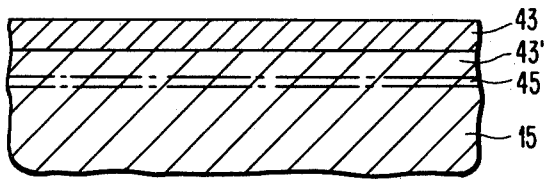
Figure 14:
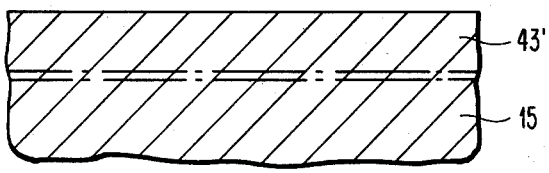

Next, as shown in FIGS. 13 and 14, the transistor structure is put through an anneal cycle wherein it is subjected to suitable treatment to electrically activate the implanted ions.

The threshold dosage is required to make the polysilicon amorphous. Amorphous polysilicon is needed to cause recrystallization at a later time. Since the implanted ions break up the interface oxide, recrystallization occurs at relatively low temperatures. This is effectively a solid state epitaxial growth process. If the dose is not sufficient to "break-up" the interface oxide, no recrystallization can occur, even at very high temperatures. During the anneal cycle, a monocrystalline silicon epitaxial layer 43' will grow from the interface with the monocrystalline epitaxial layer 15 by the consumption of amorphitized polycrystalline silicon layer 43 which is in effect converted into monocrystalline silicon during the heating cycle. Any silicon dioxide which existed as layer 45 at the interface has effectively disappeared as indicated by the phantom region 45 in FIG. 14 and FIG. 15 and does not intefere with the formation of monocrystalline silicon epitaxial layer 43'.

Annealing may be effected by laser, electron beam or by conventional thermal means, such as by heating the transistor structure. The heating cycle for thermal annealing may be any time-temperature cycle suitable for annealing out the damage to the interface in the conventional manner. For the present illustrative example, a preferred thermal cycle for annealing utilizes a two-step heating cycle involving a first heating stage at a temperature of 550° C. for two hours followed by raising the temperature to 900° C. and holding the transistor structure at 900° C. for one hour. A one-step heating cycle wherein the transistor structure is maintained at a temperature of from about 800° C. to about 1000° C. for a period of from about 30 minutes to about 4 hours is also suitable. For best results, the highest temperature in the anneal cycle should not be greater than 1000° C. in order to minimize any out-diffusion.

As illustrated in FIG. 14, the conversion of the polycrystalline silicon layer 43 to monocrystalline epitaxial silicon 43' continues until layer 43 is completely recrystallized and the resulting structure comprises a monocrystalline silicon layer 43' formed on monocrystalline epitaxial layer 15. The general concept of converting non-monocrystalline silicon to monocrystalline silicon after bombardment with neutral ions is disclosed in U.S. Pat. No. 3,900,345 to Lesk.

It should be noted that if the deposited polycrystalline silicon layer 43 is slightly thicker than needed for a final monocrystalline silicon epitaxial layer 43' it is unnecessary to completely convert the silicon layer 43 into the monocrystalline silicon layer 43'. At a suitable point before the completion of the conversion, the structure may be subjected to a conventional in situ thermal oxidization for a short period of time necessary to convert the remaining amorphous silicon layer into silicon dioxide. Then, the silicon dioxide may be selectively removed from the surface of the structure utilizing an etchant such as a conventional buffer HF etchant which selectively removes the formed silicon dioxide to expose the surface of the formed monocrystalline epitaxial layer 43'.

As shown in FIG. 9, the formed monocrystalline epitaxial layer 43' is selectively removed to provide the emitter region 47 and the collector contact 49. The subsequent formation of ohmic contacts and metallization (not shown) for the devices may be accomplished in well-known ways. It should be noted, however, that the possibility of shorting of the emitter contact to the base is eliminated due to the vertical displacement of the emitter from the base. This elimination of shorting problems is maintained even for very shallow emitter structures.

A further attribute of the transistor structure of the present invention is that the gain is increased over prior art transistor structures by a factor of 50–65 percent. The reason for this substantial and surprising improvement in performance for the transistor structure is not known. It is apparent that the combination of the performance improvements and manufacturing simplicity establishes the novel and unique characteristics of the transistor structure of the invention.

While the invention has been particularly shown and described with reference to the preferred embodiments thereof, it will be understood by those skilled in the art that the foregoing and other changes in form and details may be made therein without departing from the spirit and scope of the invention.

Having thus described our invention, what we claim as new, and desire to secure by Letters Patent is:

1. A method for forming an emitter region of a transistor comprising:

forming a subcollector region in a semiconductor substrate, depositing an epitaxial layer on said semiconductor substrate, forming a base region in said epitaxial layer of a conductivity type opposite that of the conductivity type of said subcollector, depositing a layer of non-monocrystalline silicon on said epitaxial layer, at least a portion of said non-monocrystalline silicon forming a precursor for an emitter region which is adjacent to and at least partially vertically displaced from said base region, bombarding said emitter precursor with ions of a conductivity type that is the same as the conductivity type of said subcollector at a dosage and energy sufficient to displace at least a portion of the Gaussian distribution of said ions across the interface between said non-monocrystalline layer and said epitaxial layer, and annealing the structure so as to drive said ions into said base region and to convert said non-monocrystalline silicon of said emitter precursor into a monocrystalline silicon emitter region.

2. A method in accordance with claim 1 wherein said subcollector region and said emitter region have N-type conductivity.

3. A method in accordance with claim 1 wherein said subcollector region and said emitter region have P-type conductivity.

4. A method in accordance with claim 1 wherein said non-monocrystalline silicon layer has a depth of from about 500 to about 1500 Å.

5. A method in accordance with any of claims 2–4 wherein said emitter precursor is bombarded with a combination of a doping ion and a neutral ion.

6. A method in accordance with claim 5 wherein said annealing is effected by heating the structure to a temperature and for a time sufficient to convert said non-monocrystalline silicon of said emitter precursor into a monocrystalline silicon emitter region.

7. A method in accordance with claim 6 wherein said heating is to a temperature of from about 800° C. to about 1000° C. for a period of from about 30 minutes to about 4 hours.

8. A method for fabricating an improved shallow emitter transistor structure wherein contact metal penetration of the emitter-base junction is eliminated comprising depositing a layer of non-monocrystalline silicon on a layer of monocrystalline silicon, bombarding said non-monocrystalline silicone in at least one region which is to be metallized with a doping ion at a dosage and energy sufficient to displace at least a portion of the Gaussian distribution of said ions across the interface between said non-monocrystalline layer and monocrystalline layer, annealing said transistor structure to convert said non-monocrystalline silicon in said metallization region to monocrystalline silicon, etching said non-monocrystalline silicon layer to remove said non-monocrystalline layer in those regions which are not to be metallized and applying metallization to said at least one region which remains after said etching whereby said metallization is spatially separated from said monocrystalline layer.

9. A method in accordance with claim 8 wherein said non-monocrystalline layer is bombarded with a combination of a doping ion and a neutral ion.

10. A method in accordance with claim 9 wherein said annealing is effected by heating the structure to a temperature and for a time sufficient to convert said non-monocrystalline silicon to monocrystalline silicon.

11. A method in accordance with claim 10 wherein said heating is to a temperature of from about 800° C. to about 1000° C. for a period of from about 30 minutes to about 4 hours.

* * * * *